United States Patent
Chang

(10) Patent No.: US 8,248,799 B2
(45) Date of Patent: Aug. 21, 2012

(54) DATA CENTER

(75) Inventor: Yao-Ting Chang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 185 days.

(21) Appl. No.: 12/871,855

(22) Filed: Aug. 30, 2010

(65) Prior Publication Data

US 2012/0026676 A1    Feb. 2, 2012

(30) Foreign Application Priority Data

Jul. 28, 2010    (TW) ................ 99124825 A

(51) Int. Cl.
*H05K 7/20* (2006.01)

(52) U.S. Cl. ........ 361/696; 361/690; 361/691; 361/692; 361/693; 361/694; 361/695; 454/184

(58) Field of Classification Search ........................ None
See application file for complete search history.

(56) References Cited

U.S. PATENT DOCUMENTS

| | | | |
|---|---|---|---|
| 5,544,012 A * | 8/1996 | Koike | 361/695 |
| 7,046,513 B2 * | 5/2006 | Nishiyama et al. | 361/695 |
| 7,061,715 B2 * | 6/2006 | Miyamoto et al. | 360/99.25 |
| 7,184,267 B2 * | 2/2007 | Patel | 361/692 |
| 7,254,022 B2 * | 8/2007 | Ebermann | 361/696 |
| 7,286,345 B2 * | 10/2007 | Casebolt | 361/679.48 |
| 7,903,407 B2 * | 3/2011 | Matsushima et al. | 361/695 |
| 7,957,142 B2 * | 6/2011 | Noteboom et al. | 361/696 |
| 7,961,463 B2 * | 6/2011 | Belady et al. | 361/695 |
| 8,004,839 B2 * | 8/2011 | Sato et al. | 361/696 |

* cited by examiner

*Primary Examiner* — Boris Chervinsky
(74) *Attorney, Agent, or Firm* — Altis Law Group, Inc.

(57) ABSTRACT

A data center includes a housing, a number of server modules arranged in the housing, a number of cooling units arranged in the housing and above the server modules, and a fan mounted in the housing near the cooling units. When the data center is operating, heated air is driven to the cooling units by fans, and then the cooled air is driven to enter the server modules.

5 Claims, 1 Drawing Sheet

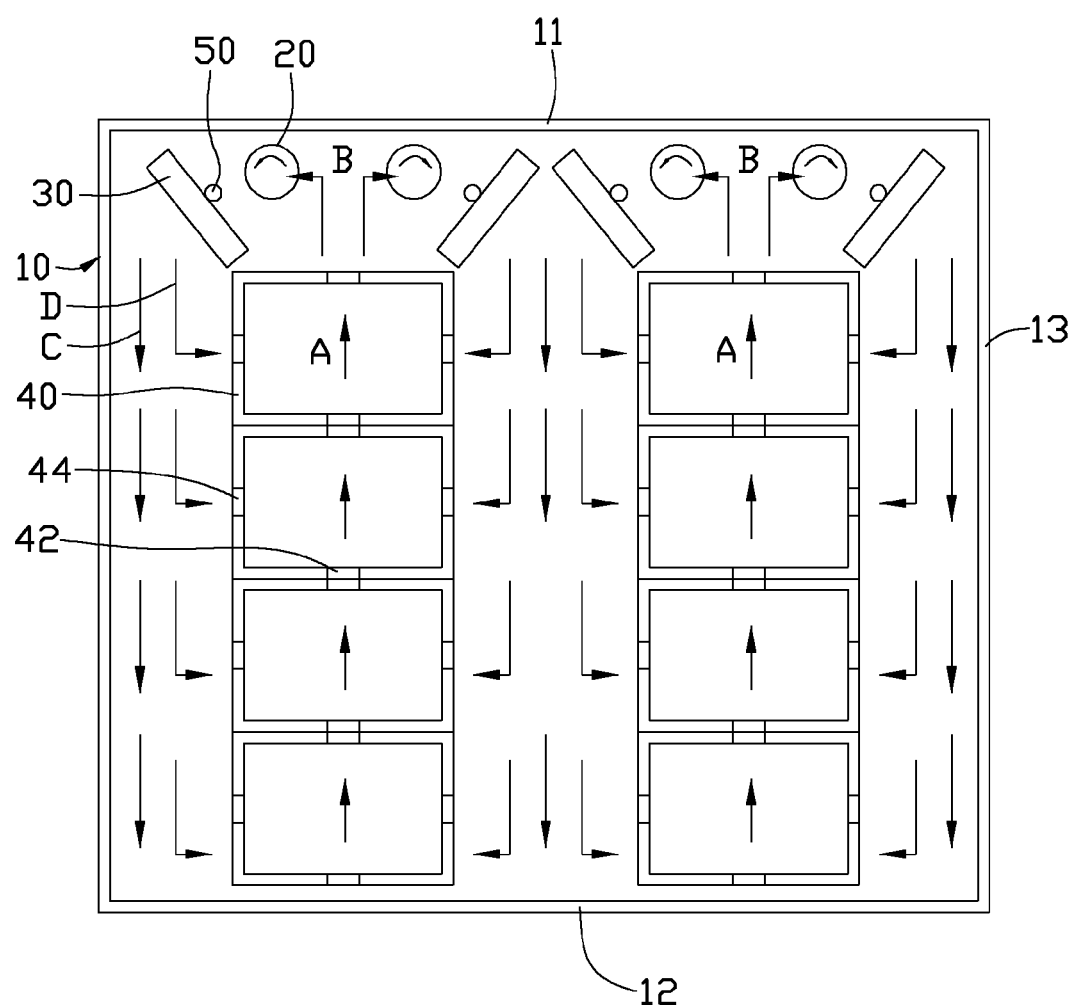

DATA CENTER

BACKGROUND

1. Technical Field

The present disclosure relates to a data center.

2. Description of Related Art

A data center usually includes a number of server modules arranged in a housing of the data center. The airflow for heat dissipation is generally from front to back through the server modules. As a result, the temperature around the back side of the server modules can be much higher that at the front and very uncomfortable to operators needing to do any work near the back side of the housing.

BRIEF DESCRIPTION OF THE DRAWING

Many aspects of the present embodiments can be better understood with reference to the following drawing. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

The FIGURE is a sketch view of an embodiment of a data center.

DETAILED DESCRIPTION

The disclosure, including the accompanying drawing, is illustrated by way of examples and not by way of limitation. It should be noted that references to "an" or "one" embodiment in this disclosure are not necessarily to the same embodiment, and such references mean at least one.

Referring to the FIGURE, an exemplary embodiment of a data center includes a housing 10. The housing 10 includes a top wall 11, a bottom wall 12 opposite to the top wall 11, and opposite left and right sidewalls 13 connected between the top wall 11 and the bottom wall 12. Several server module assemblies are arranged in the housing 10 and spaced from each other. Each server module assembly includes a number of server modules 40 stacked upright in the housing 10. Airflow interspaces are arranged between each server module assembly and the left and right sidewalls 13 of the housing 10. Each server module 40 defines a number of through holes 42, 44 respectively facing towards the top wall 11, the bottom wall 12, and the left and right sidewalls 13 of the housing 10. Two cooling units 30, such as heat exchangers or water chillers, are arranged in the housing 10 near the top wall 11, respectively facing towards each server module assembly. The cooling units 30 are located above these server module assemblies, and incline outwardly. Two fans 20 are arranged between the cooling units 30 above each stack of server module assemblies and near the cooling units 30.

When the data center runs, heated air from the server module assembly flows out of the server modules 40 through the through holes 42 of the top and bottom sidewalls of the server modules 40 along A direction, then toward the fans 20 along direction B, and is then driven to the corresponding cooling units 30 by the fans 20. The heated air is cooled by the cooling units 30. Cooled air goes down and enters the server modules 40 through the through holes of the server modules 40 facing towards the left and right sidewalls 13 of the housing 10, along C and D directions, to cool the server modules 40. As a result, in the present disclosure, heated air is cooled in the housing 10 rather than being vented through the front wall or the back wall of the housing 10. That is to say, operators can work at the front and back of the housing 10 comfortably.

Furthermore, a plurality of temperature sensing elements 50 can be arranged in the housing 10 adjacent to the fans 20, for sensing the temperature of the airflow near the fans 20, to control the rotation speed of the fans 20.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A data center comprising:
   a housing comprising a top wall, a bottom wall opposite to the top wall, and opposite left and right sidewalls;
   a plurality of server modules arranged in the housing, wherein each server module defines a plurality of through holes respectively facing towards the top wall, the bottom wall, the left and right sidewalls of the housing;
   a plurality of cooling units arranged in the housing near the top wall and above the server modules; and
   a plurality of fans arranged in the housing, adjacent to and disposed between the cooling units;
   wherein when the data center runs, heated air flows out of the plurality of server modules through the plurality of through holes of the server modules respectively facing towards the top wall, the bottom wall of the housing, and is then driven to the corresponding cooling units by the plurality of fans, the heated air is cooled by the plurality of cooling units, cooled air goes down and enter the plurality of server modules through the plurality of through holes of the plurality of server modules respectively facing towards the left and right walls of the housing to cool the plurality of server modules.

2. The data center of claim 1, wherein the plurality of server modules are stacked upright in the housing, each two cooling units are located above the stacked server modules.

3. The data center of claim 2, wherein two of the plurality of fans are located between the two of the plurality of cooling units located above the stacked server modules.

4. The data center of claim 1, further comprising a plurality of temperature sensing elements arranged in the housing adjacent to the plurality of fans, for sensing the temperature of the airflow near the plurality of fans.

5. The data center of claim 1, wherein the plurality of cooling units are heat exchangers or water chillers.

* * * * *